(12) United States Patent
Takahashi

(10) Patent No.: US 6,201,744 B1
(45) Date of Patent: Mar. 13, 2001

(54) SEMICONDUCTOR MEMORY CIRCUIT AND REDUNDANCY CONTROL METHOD

(75) Inventor: Kazuhiko Takahashi, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/317,105

(22) Filed: May 24, 1999

(30) Foreign Application Priority Data

Dec. 28, 1998 (JP) .................................................. 10-372072

(51) Int. Cl.⁷ .................................................. G11C 13/00
(52) U.S. Cl. ...................................... 365/200; 365/189.01
(58) Field of Search ............................................. 365/200

(56) References Cited

U.S. PATENT DOCUMENTS 6,018,483 * 1/2000 Poechmueller et al. ............. 365/200
6,023,433 * 2/2000 Kashikawa ........................... 365/200
6,078,534 * 6/2000 Pfefferl et al. ....................... 365/200

* cited by examiner

Primary Examiner—Terrell W. Fears
(74) Attorney, Agent, or Firm—Jones Volentine, L.L.C.

(57) ABSTRACT

In a semiconductor memory device having redundant memory cells and sense amplifiers, when a redundant memory cell is accessed in place of a defective memory cell, the sense amplifier to which the defective memory cell is coupled and the redundant sense amplifier to which redundant memory cell is coupled are both activated simultaneously. Access to the defective memory cell is redirected to the redundant memory cell by switching data paths on a data bus to which both sense amplifiers are coupled. High-speed access is possible, because activation of the sense amplifiers and switching of the data paths take place concurrently.

18 Claims, 25 Drawing Sheets

SEMICONDUCTOR MEMORY CIRCUIT AND REDUNDANCY CONTROL METHOD

BACKGROUND OF THE INVENTION

1. Field of the Invention

The present invention relates to a semiconductor memory circuit having redundant memory cells for use in place of defective memory cells.

2. Description of the Related Art

In the manufacture of a memory device disposed on a semiconductor chip, small defects present in the chip frequently disable one or a few memory cells, while the other memory cells and circuits operate normally. Manufacturing yields can be improved if the chip is provided with redundant memory cells, which can be accessed in place of the defective memory cells.

Various redundancy schemes are known and used. Some schemes have redundant columns of memory cells; others have redundant rows of memory cells. Typical schemes employ a reconfiguration circuit that is programmed by means of laser-blown fuses, to determine whether redundant or non-redundant memory cells are accessed.

One conventional redundancy scheme provides redundant columns of memory cells, which are coupled to redundant sense amplifiers. The reconfiguration circuit is programmed to send enable signals to the line drivers that activate the sense amplifiers. When a column with a defective memory cell is addressed, the reconfiguration circuit disables the corresponding line driver and enables the line driver of a redundant column instead.

One problem with this replacement scheme is that it limits the access speed of the memory device, because the reconfiguration circuit must operate before activation of the sense amplifiers can begin. In memory devices that provide high-speed access to a plurality of memory cells, there are also timing problems caused by different signal propagation delays when the redundant column and the column it replaces are disposed in widely separated locations.

In a variation of this conventional scheme, the reconfiguration circuit operates by shifting columns so that when a column with a defective memory cell is accessed, it is replaced by the lower adjacent column, which is replaced by the next-lower column, and so on, the lowest column being a redundant column. This variation substantially eliminates the problem of timing differences, because each column is replaced by an adjacent column, but the problem of delayed sense amplification remains.

A further problem in these conventional replacement and shifting schemes occurs in memory devices permitting masked access such as write-per-bit access. In this case, besides controlling the column drivers, the reconfiguration circuit must perform a similar type of replacement or shifting control of the masking circuits.

Further information about these conventional schemes and their problems will be given following the detailed description of the invention.

SUMMARY OF THE INVENTION

An object of the present invention is to provide high-speed access in a semiconductor memory device having redundant memory cells.

Another object is to simplify masking control in a semiconductor memory device having redundant memory cells.

The invented method of controlling access to redundant and non-redundant memory cells in a semiconductor memory device comprises the steps of:

simultaneously activating a first sense amplifier coupled to a defective non-redundant memory cell and a second sense amplifier coupled to a redundant memory cell; and switching data paths on a data bus to which the first and second sense amplifiers are coupled, thereby redirecting access from the defective non-redundant memory cell to the redundant memory cell.

The invented semiconductor memory device has a plurality of non-redundant sense amplifiers coupled to non-redundant memory cells, and at least one redundant sense amplifier coupled to a plurality of redundant memory cells. A data bus with switchable data paths is coupled to the redundant and non-redundant sense amplifiers. A redundancy control circuit receives an address signal, and switches the data paths on the data bus when a defective non-redundant memory cell is addressed, thereby redirecting access from the defective memory cell to a redundant memory cell. A driving circuit simultaneously activates both the redundant sense amplifier and the non-redundant sense amplifier to which the defective memory cell is coupled.

In a memory device having masking circuits, the switching circuits on the data bus paths are disposed between the masking circuits and the sense amplifiers.

The invented method and memory device provide high-speed access because activation of the sense amplifiers is not delayed by the switching of data paths.

Masking is simplified because the masking circuits operate in the same way, regardless of whether or not the data bus paths are switched.

DETAILED DESCRIPTION OF THE INVENTION

Figure 1:
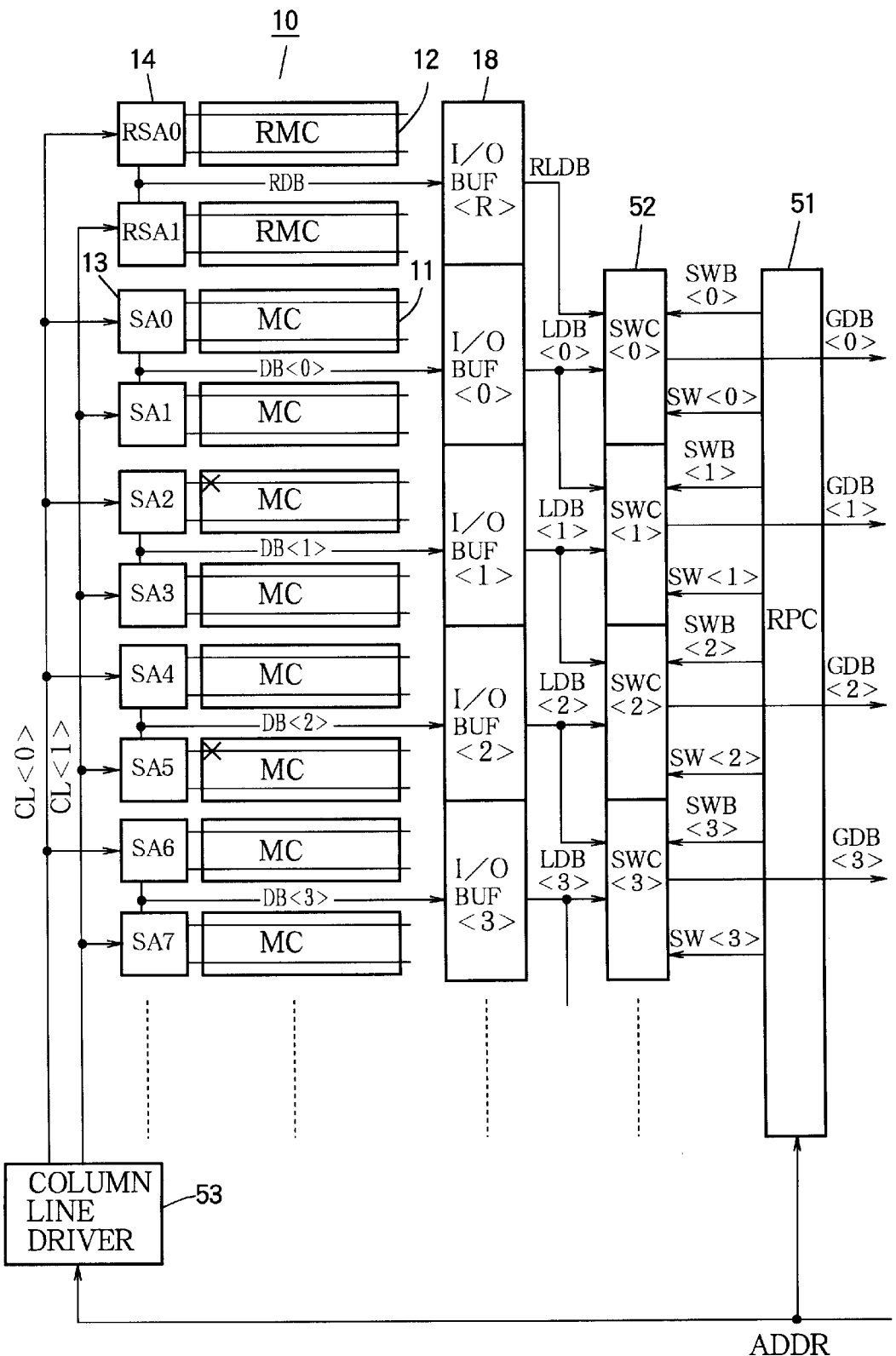
FIG. 1 is a block diagram of part of a semiconductor memory device illustrating a first embodiment of the invention.

Embodiments of the invention will be described with reference to the attached drawings, in which like parts are identified by like reference characters.

Referring to FIG. 1, a first embodiment of the invention is a random-access memory device having a memory cell array 10 with plural columns of non-redundant memory cells (MC) 11 and two columns of redundant memory cells (RMC) 12. The columns are horizontal in the drawing. Each non-redundant column of memory cells 11 is coupled by a pair of bit lines to a corresponding non-redundant sense amplifier (SA) 13. Each redundant column of memory cells 12 is coupled to a corresponding redundant sense amplifier (RSA) 14. The two redundant sense amplifiers 14 are coupled by a shared redundant data bus line RDB to an input-output buffer (I/O BUF) 18. Similarly, pairs of non-redundant sense amplifiers 13 are coupled by data bus lines DB<0>, DB<1>, . . . to other input-output buffers 18. The input-output buffers 18 are coupled by local data bus lines RLDB, LDB<0>, LDB<1>, . . . through switching circuits 52 to global data bus lines GDB<0>, GDB<1>, . . . . The global data bus lines are interfaced through other circuits (not visible) to the external terminals of the memory device. The total number of global data bus lines is, for example two hundred fifty-six (GDB<0>, . . . , GDB<255>).

Each switching circuit 52 is coupled to two mutually adjacent local data bus lines and one global data bus line. The first switching circuit SWC<0> is coupled to RLDB, LDB<0>, and GDB<0>. Each other switching circuit SWC<n> is coupled to LDB<n−1>, LDB<n>, and GDB<n>, (n=1, 2, . . . ). The global data bus lines are thus coupled to the local data bus lines in order from zero to the maximum n, with the switching circuits 52 capable of shifting the order by one position toward the redundant local data bus line RLDB. The internal structure of the switching circuits 52 will be shown later, in the third embodiment. The local data bus lines are coupled through the input-output buffers 18 to the sense amplifiers in a fixed order.

The switching circuits 52 are controlled by respective switching signals SW<0>, SW<1>, . . . and SWB<0>, SWB<1>, . . . from a redundancy programming circuit (RPC) 51. The redundancy programming circuit 51 generates these switching signals from an input address signal ADDR. The redundancy programming circuit 51 comprises, for example, a fuse-programmable read-only memory circuit (ROM) that is programmed with the addresses of defective memory cells when the memory device is electrically tested by the memory manufacturer. During operation, the redundancy programming circuit 51 compares the programmed addresses with the input address signal ADDR. The redundancy programming circuit 51 constitutes a redundancy control circuit.

The input address signal ADDR is also supplied to a column line driver 53, which is coupled by two column signal lines CL<0> and CL<1> to the sense amplifiers 13, 14. CL<0> is coupled to the even-numbered sense amplifiers RSA0, SA0, SA2, . . . , while CL<1> is coupled to the odd-numbered sense amplifiers RSA1, SA1, SA3, . . . . By activating one of these two column signal lines, the column line driver 53 activates the coupled sense amplifiers 13, 14 and provides access to memory cells in either the even columns or the odd columns.

The memory cells, which are not individually visible in the drawing, are disposed in vertical rows, selected by word lines, also not visible.

Next, the operation of the first embodiment will be described for three cases. The first case illustrates read access when no defective memory cells are present. The second and third cases illustrate read access when defective memory cells are present at the locations marked X in FIG. 1.

Figure 2:
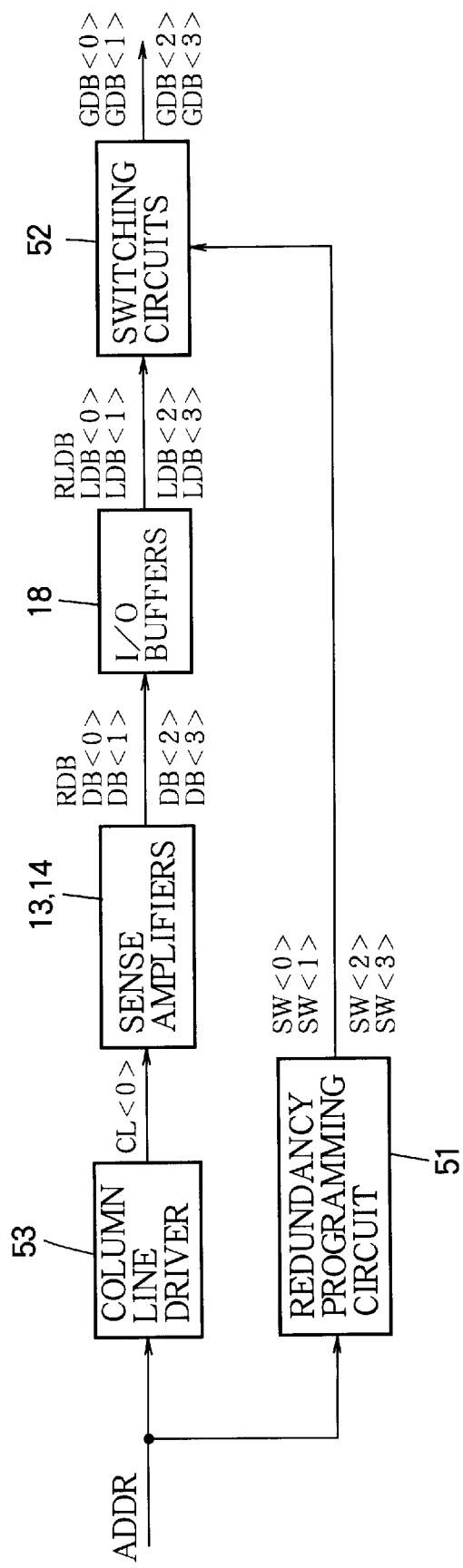
FIG. 2 is a simplified block diagram illustrating the operation of the first embodiment.
Figure 3:
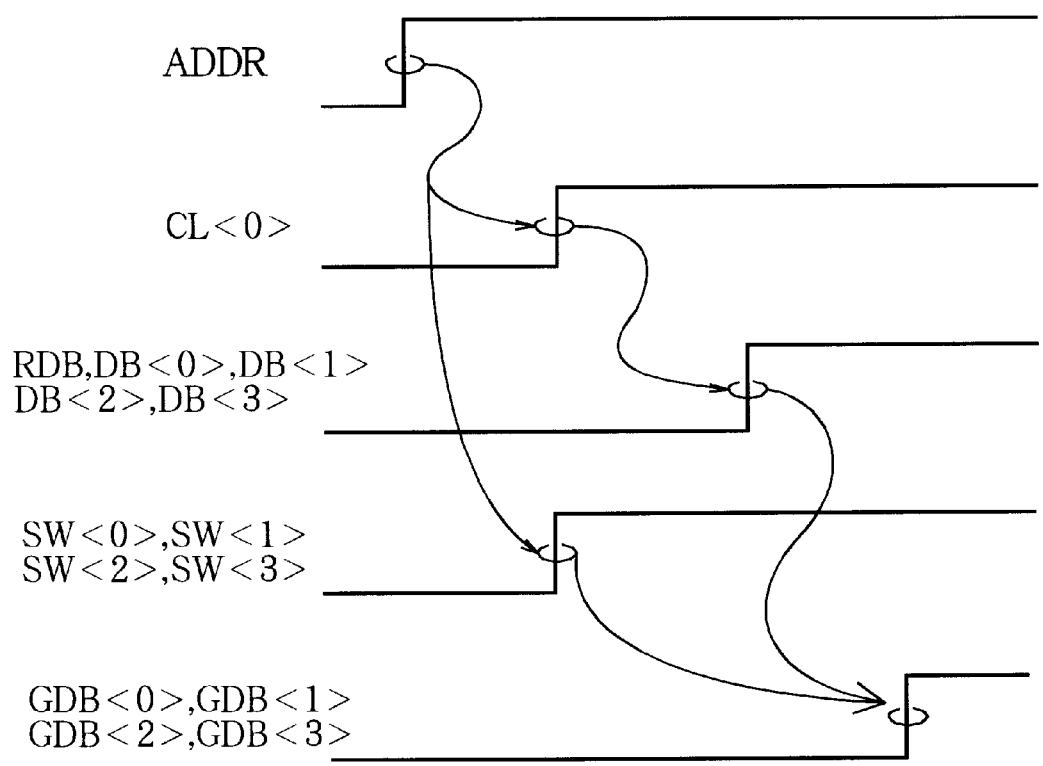
FIG. 3 is a timing diagram illustrating the operation shown in FIG. 2.

FIG. 2 indicates which of the signals shown in FIG. 1 are activated in the first case, when the input address signal ADDR designates the even-numbered columns of memory cells. Upon receiving the address signal, the column line driver 53 activates column signal line CL<0> and the redundancy programming circuit 51 activates switching signals SW<0>, SW<1>, SW<1>, SW<3>. Switching signals SWB<0>, SWB<1>, SWB<2>, SWB<3 > are left inactive, because no defective memory cell is addressed. The sense amplifiers RSA<0>, SA<0>, SA<2>, SA<4>, SA<6> coupled to column signal line CL<0> are activated, and amplify data read from one row of memory cells 11, 12. The amplified data are transferred on data bus lines RDB, DB<0>, DB<1>, DB<2>, DB<3> to the input-output buffers 18, then on local data bus lines RLDB, LDB<0>, LDB<1>, LDB<2>, LDB<3> to the switching circuits 52. The switching signals received from the redundancy programming circuit 51 cause the switching circuits 52 to couple local data bus LDB(n) to global data bus line GDB(n) (n=0, 1, 2, . . . ). Thus the data read from the non-redundant memory cells 11 are output on the global data bus lines. FIG. 3 indicates the timing of these operations.

Figure 4:
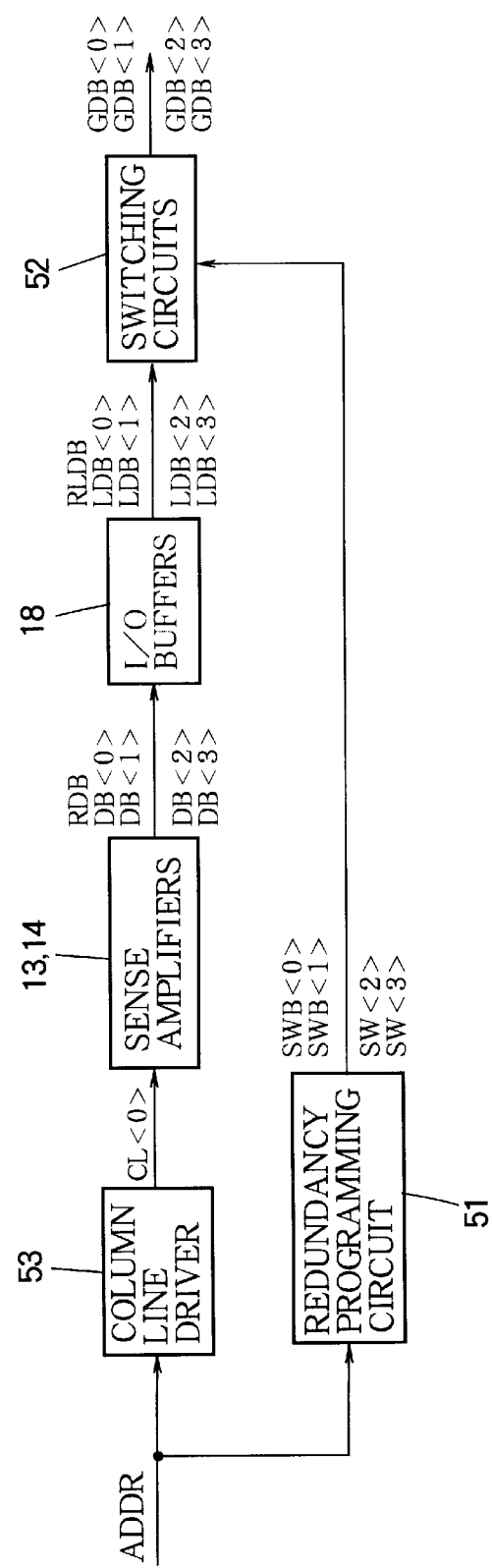
FIG. 4 is another simplified block diagram illustrating the operation of the first embodiment.
Figure 5:
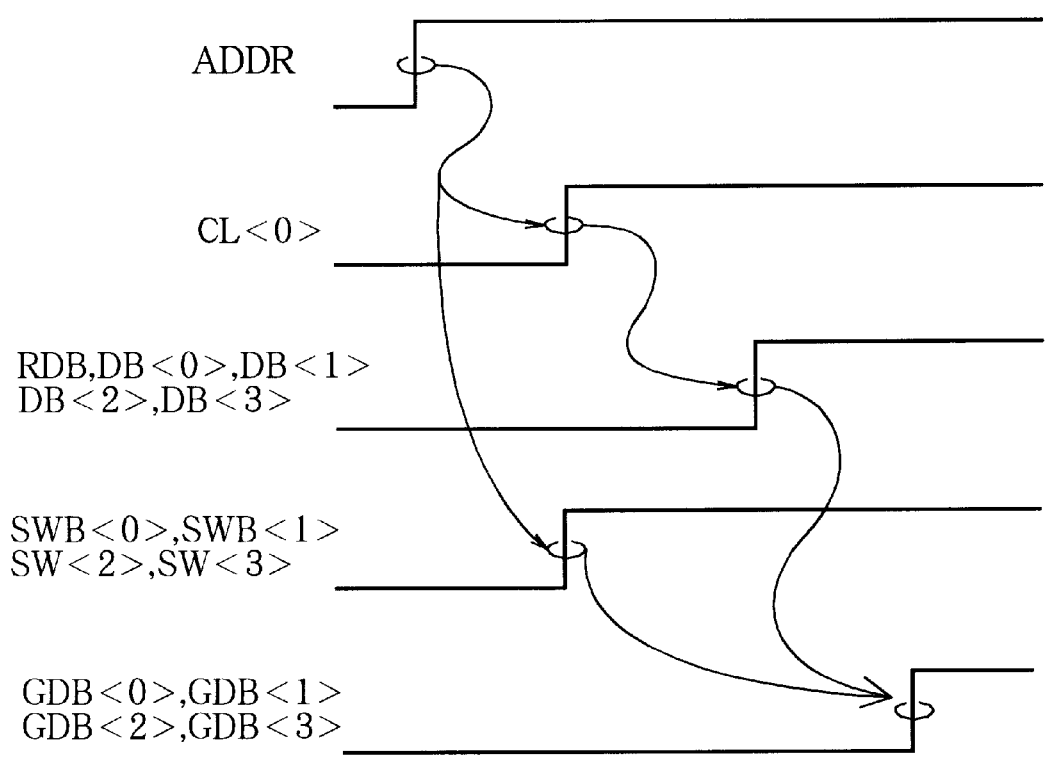
FIG. 5 is a timing diagram illustrating the operation shown in FIG. 4.
Figure 6:
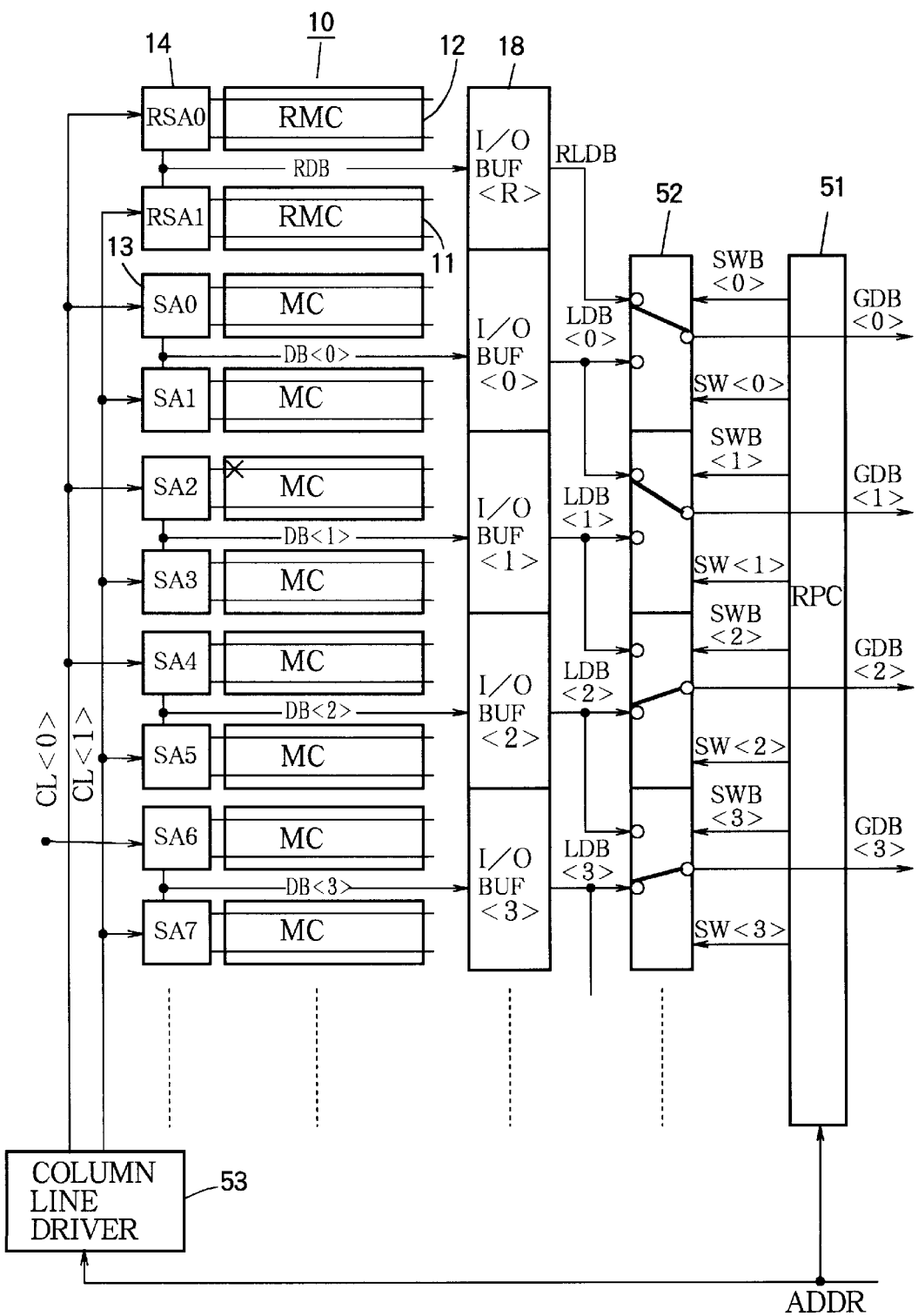
FIG. 6 is a block diagram illustrating the operation shown in FIG. 4.

FIG. 4 indicates the signals that are activated in the second case. The difference from the first case is that, because of the defective memory cell in the column coupled to sense amplifier SA2, the redundancy programming circuit 51 has been programmed to respond to an address signal ADDR indicating even-numbered columns by activating switching signals SWB<0>, SWB<1>, SW<2>, SW<3>. The sense amplifiers 13, 14 and input-output buffers 18 operate as in the first case, but the switching circuits 52 couple local data bus lines RLDB, LDB<0>, LDB<2>, LDB<3> to the global data bus lines GDB<0>, GDB<1>, GDB<2>, GDB<3>, omitting local data bus line LDB<1>. FIG. 5 indicates the timing of these operations. FIG. 6 schematically indicates the operation of the switching circuits 52.

Figure 7:
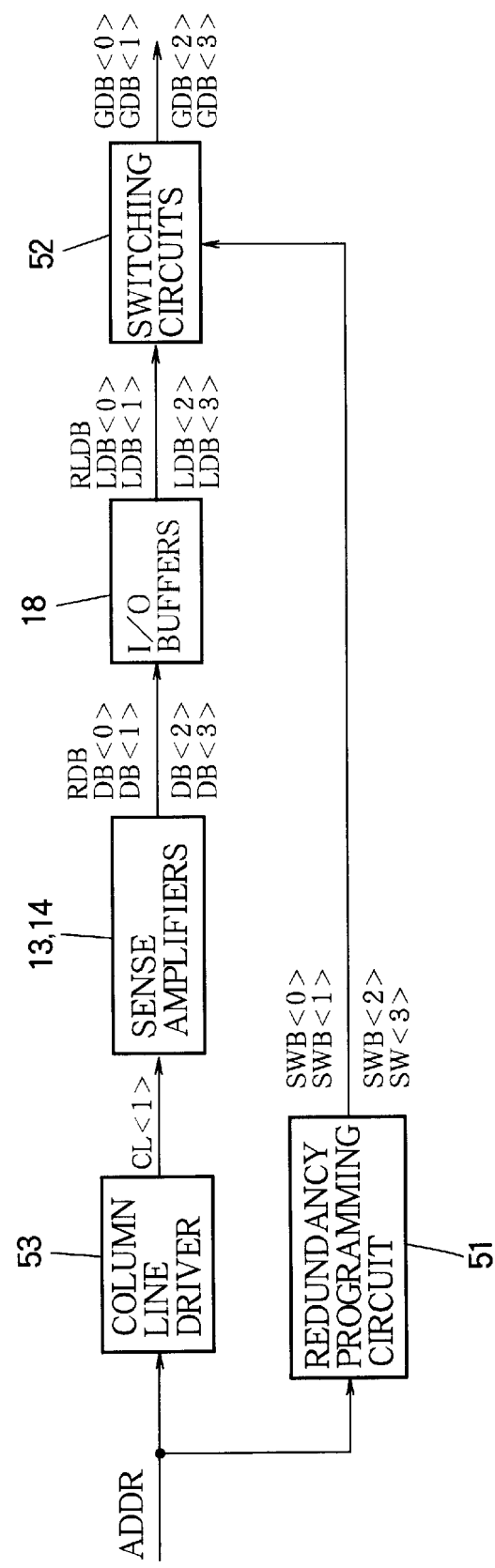
FIG. 7 is another simplified block diagram illustrating the operation of the first embodiment.
Figure 8:
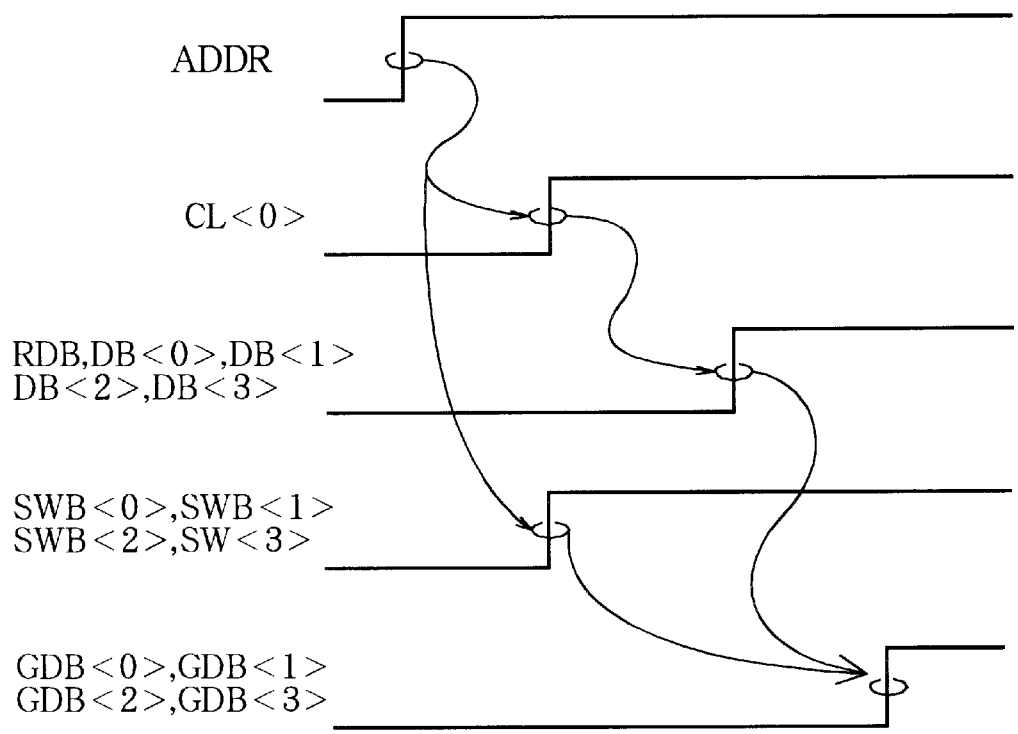
FIG. 8 is a timing diagram illustrating the operation shown in FIG. 7.
Figure 9:
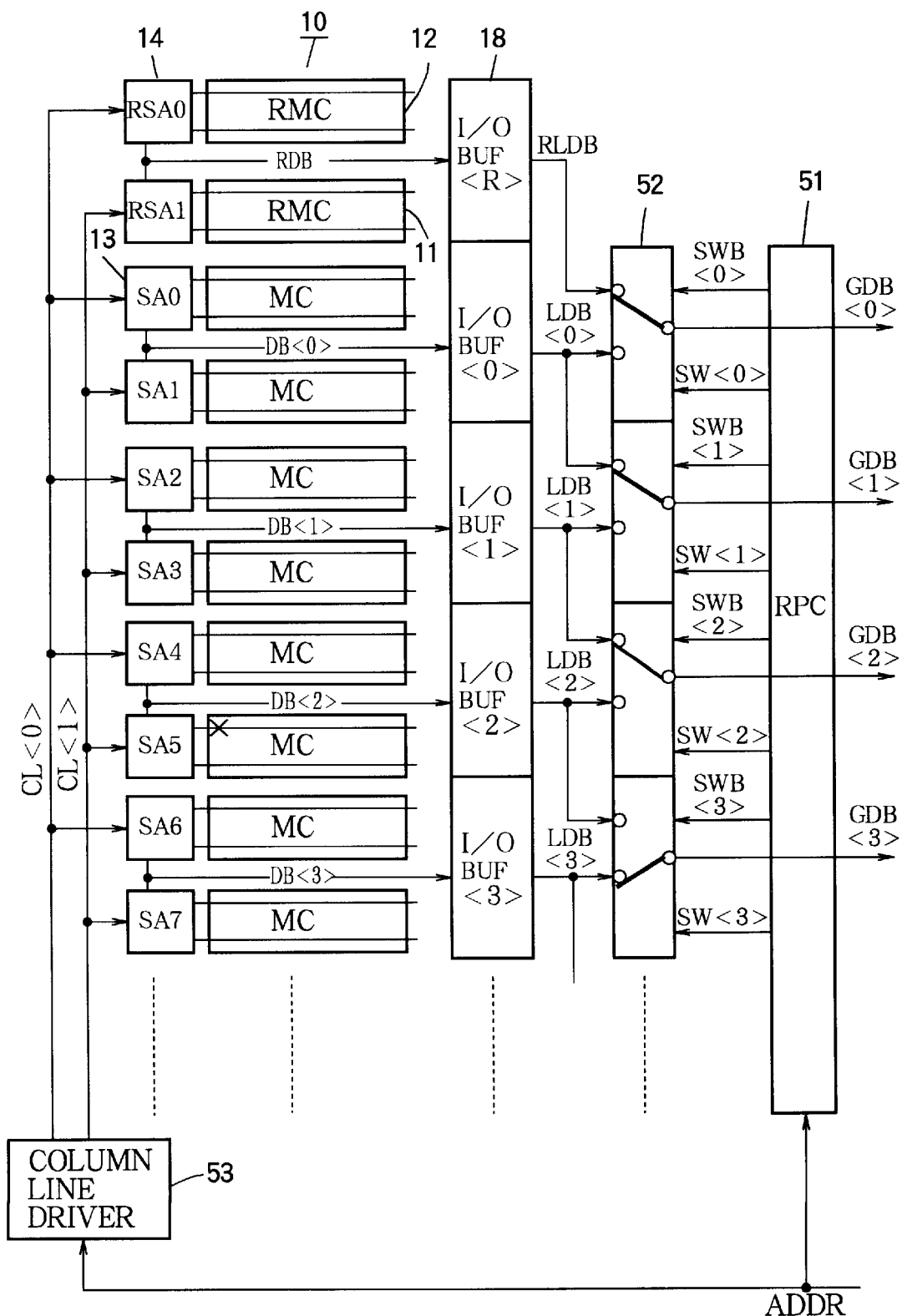
FIG. 9 is a block diagram illustrating the operation shown in FIG. 7.

FIG. 7 indicates the signals that are activated in the third case, in which the address signal ADDR designates the odd-numbered columns. The column line driver 53 activates column signal line CL<1>, Since the defective memory cell is disposed in the column coupled to sense amplifier SA5, the redundancy programming circuit 51 has been programmed to respond to an odd address by activating switching signals SWB<0>, SWB<1>, SWB<2>, SW<3>. The odd-numbered sense amplifiers RSA1, SA1, SA3, SA5, SA7 are activated, and the amplified data are transferred to the input-output buffers 18. The switching circuits 52 couple local data bus lines RLDB, LDB<0>, LDB<1>, LDB<3> to the global data bus line GDB<0>, GDB<1>, GDB<2>, GDB<3>, omitting the local data bus line with defective data, which is now LDB<2>. FIG. 8 indicates the timing of these operations. FIG. 9 indicates the operation of the switching circuits 52.

Write access is similar, with data being transferred in the opposite direction: from the global data bus lines through the switching circuits 52 to the local data bus lines, then through the sense amplifiers 13, 14 to the memory cells 11, 12.

As indicated by FIGS. 3, 5, and 8, the first embodiment operates with the same timing regardless of whether defective memory cells are present or absent. The redundancy programming circuit 51 and column line driver 53 operate concurrently. Similarly, the switching circuits 52 and sense amplifiers 13, 14 operate concurrently. High-speed access is possible because the operation of the redundancy programming circuit 51 and switching circuits 52 does not delay the activation of the sense amplifiers.

The propagation delays and switching delays in the redundancy programming circuit 51 and switching circuits 52 do not limit the memory access speed at all, because they are hidden by the longer sense amplification delay. By the time the sense amplifiers 13, 14 are ready to output data read from the memory cells, the switching circuits have already completed the necessary connections between the local and global data bus lines.

As indicated by FIGS. 6 and 9, the lengths of the data paths on the data bus lines are not greatly changed by the substitution of redundant memory cells for defective memory cells. The signal propagation delays on the data paths are substantially unaffected by the switching of the data paths. The first embodiment can therefore be practiced in a dynamic random-access memory (DRAM) of the high-speed synchronous type, for example, without causing timing problems.

The number of column signal lines in the first embodiment is not limited to two. There may be more than two column signal lines; there may be only one column signal line. The number of column signal lines corresponds to the number of sense amplifiers 13, 14 coupled to each data bus line. For example, if eight sense amplifiers are coupled to each data bus line, then eight column signal lines are provided.

The number of local data bus lines coupled to each global data bus line is not limited to the one local data bus line shown in the drawings. For example, the memory device may comprise a plurality of memory cell arrays with separate local data lines and shared global data lines, each global data line being coupled to one local data line in each memory cell array.

Next, a second embodiment will be described. The second embodiment interchanges the positions of the input-output buffers 18 and switching circuits 52.

Figure 10:
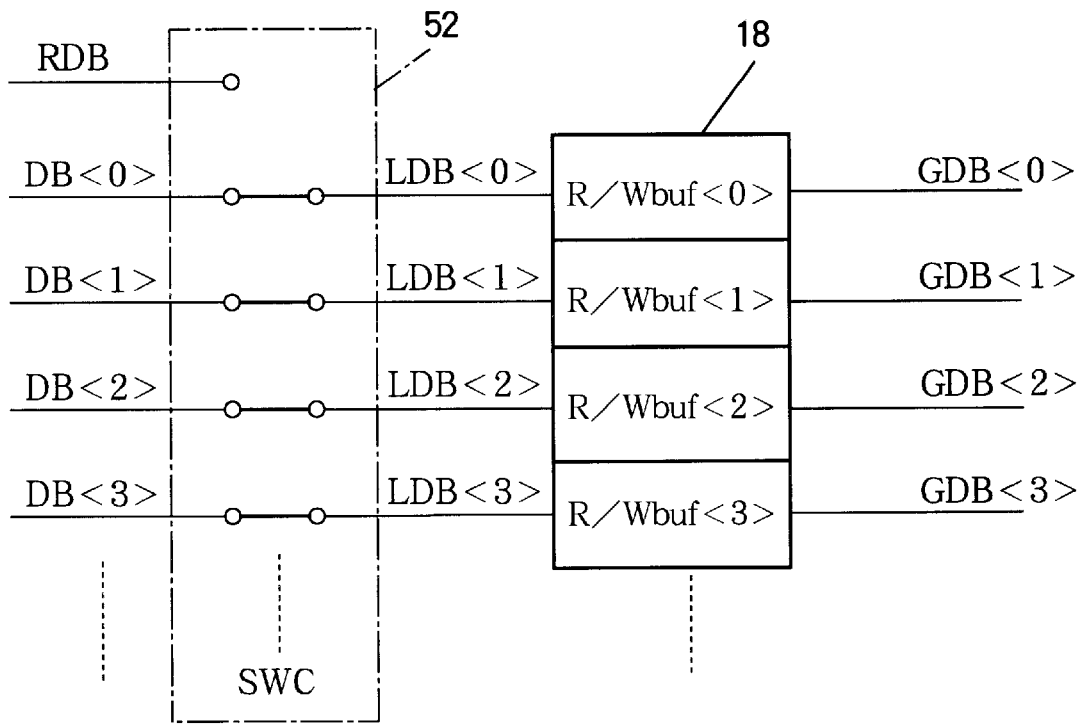
FIG. 10 is a schematic diagram of part of a semiconductor memory device illustrating a second embodiment of the invention.

Referring to FIG. 10, in the second embodiment, the data bus lines RDB, DB<0>, DB<1>, . . . , are coupled to the switching circuits 52, which are coupled by local data bus lines to the input-output buffers 18. Aside from this difference, the second embodiment has the same structure as the first embodiment, shown in FIG. 1. The read-write buffer circuits R/Wbuf<0>, R/Wbuf<1>, R/Wbuf<2>, . . . are similar to the input-output buffer circuits in FIG. 1, but the total number of buffer circuits is reduced by one, because no separate buffer circuit is required for the redundant data bus line RDB in the second embodiment. The number of local data bus lines is also reduced by one.

Figure 11:
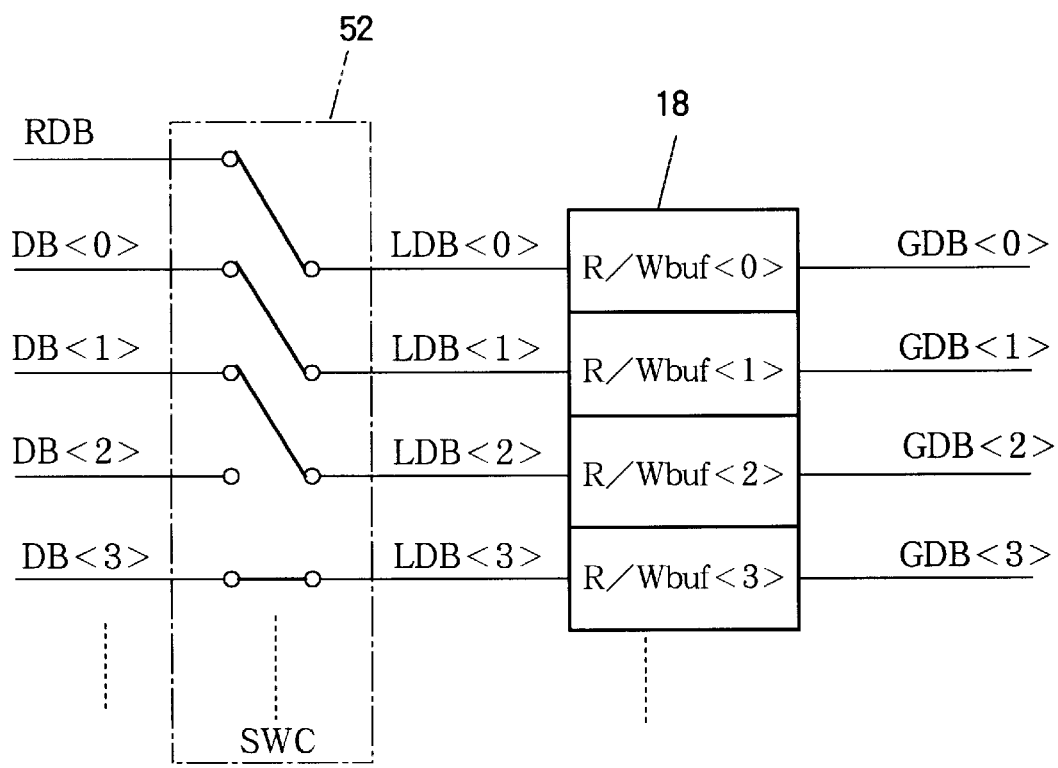
FIG. 11 is another schematic diagram illustrating the second embodiment.

The second embodiment operates in the same way as the first embodiment, the switching circuit 52 being controlled by the redundancy programming circuit 51. FIG. 10 shows the case in which there are no defective memory cells and the redundant memory cells are not used. FIG. 11 shows the case in which the memory cell accessed via data bus line DB<2> is defective; the switching circuit 52 shifts the connections of buffer circuits R/Wbuf<0>, R/Wbuf<1>, and R/Wbuf<2> upward, so as to skip data bus line DB<2>.

The second embodiment provides the same effects as the first embodiment, while requiring fewer buffers.

Next, a third embodiment will be described. The third embodiment includes masking circuits.

Figure 12:
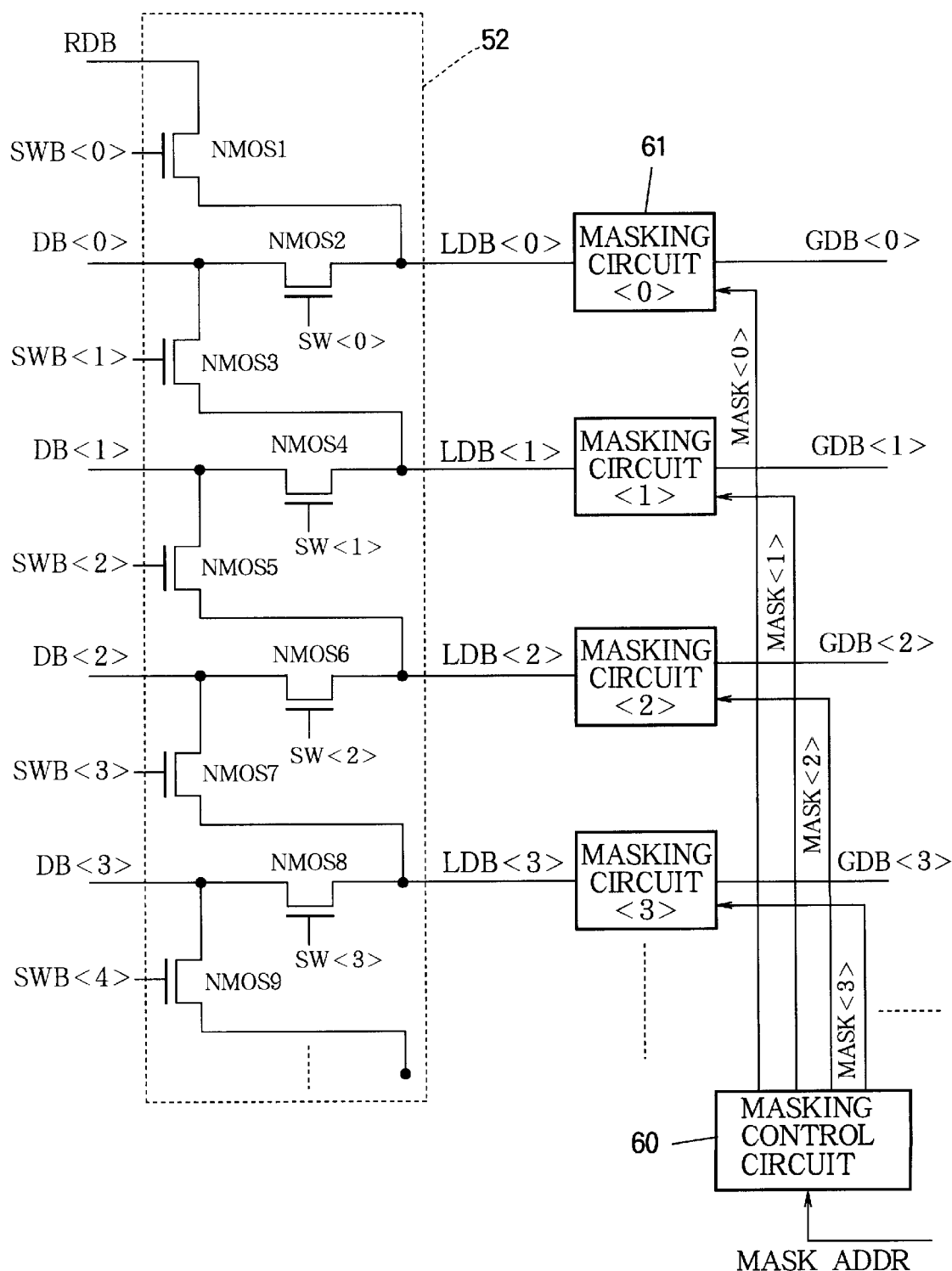
FIG. 12 is a schematic diagram of part of a semiconductor memory device illustrating a third embodiment of the invention.

Referring to FIG. 12, the switching circuits 52 are disposed between the data bus lines RDB, DB<0>, DB<1>, . . . and the local data bus lines LDB<0>, LDB<1>, . . . , as in the second embodiment. FIG. 12 also shows the internal structure of the switching circuits 52. The first switching circuit comprises n-channel metal-oxide-semiconductor transistors NMOS1 and NMOS2, through which local data bus line LDB<0> is coupled to data bus lines RDB and DB<0>, respectively. Switching signal SWB<0> is supplied to the gate electrode of NMOS1, while switching signal SW<0> is supplied to the gate electrode of NMOS2. The other switching circuits comprise similar pairs of transistors. The switching signals are active high.

The local data bus lines LDB<0>, LDB<1>, . . . are coupled to respective masking circuits 61, which are controlled by masking signals MASK<0>, MASK<1>, . . . , from a masking control circuit 60. When the masking signals are inactive, the masking circuits 61 transmit data between the global and local data bus lines. When a particular masking signal is activated, the data output of the corresponding masking circuit 61 onto the corresponding local data bus line is placed in the high-impedance state. The masking circuits 61 replace the input-output buffers 18 shown in the second embodiment.

The masking signals are used in a write-per-bit mode of write access in which some bits of write data supplied to the memory device are stored in the corresponding memory cells, while other bits are ignored. If a bit is not to be stored, the corresponding masking signal is activated. During the access, the corresponding memory cell is read, but the sense amplifier retains the data value read from the memory cell, without being affected by the external write data value on the global bus line, which is masked by the corresponding masking circuit 61. Thus the stored data value is not changed; the memory cell is merely refreshed.

The masking control circuit 60 comprises, for example, a mask register in which the bits to be masked are designated in advance, by data supplied on a mask address signal line (MASK ADDR).

In regard to the use or non-use of the redundant memory cells, the third embodiment operates in the same way as the first and second embodiments. Masking control is not affected by redundancy control, because the switching circuits 52 are located between the masking circuits 61 and the memory cell array. When writing to the first bit of data is masked, for example, masking signal MASK<0> is activated, regardless whether the first bit is stored in a non-redundant memory cell 11 accessed via data bus line DB<0>, or a redundant memory cell 12 accessed via data bus line DB<1>.

The third embodiment provides the same effects as the second embodiment, with the additional effect that the masking control circuit 60 only has to respond to mask address input, and not to redundancy control signals from the redundancy programming circuit.

In a variation of the third embodiment, the masking circuits are also used to mask particular bits during read access, to allow mixed access to two different memory cell arrays in the memory device, for example.

Figure 13:
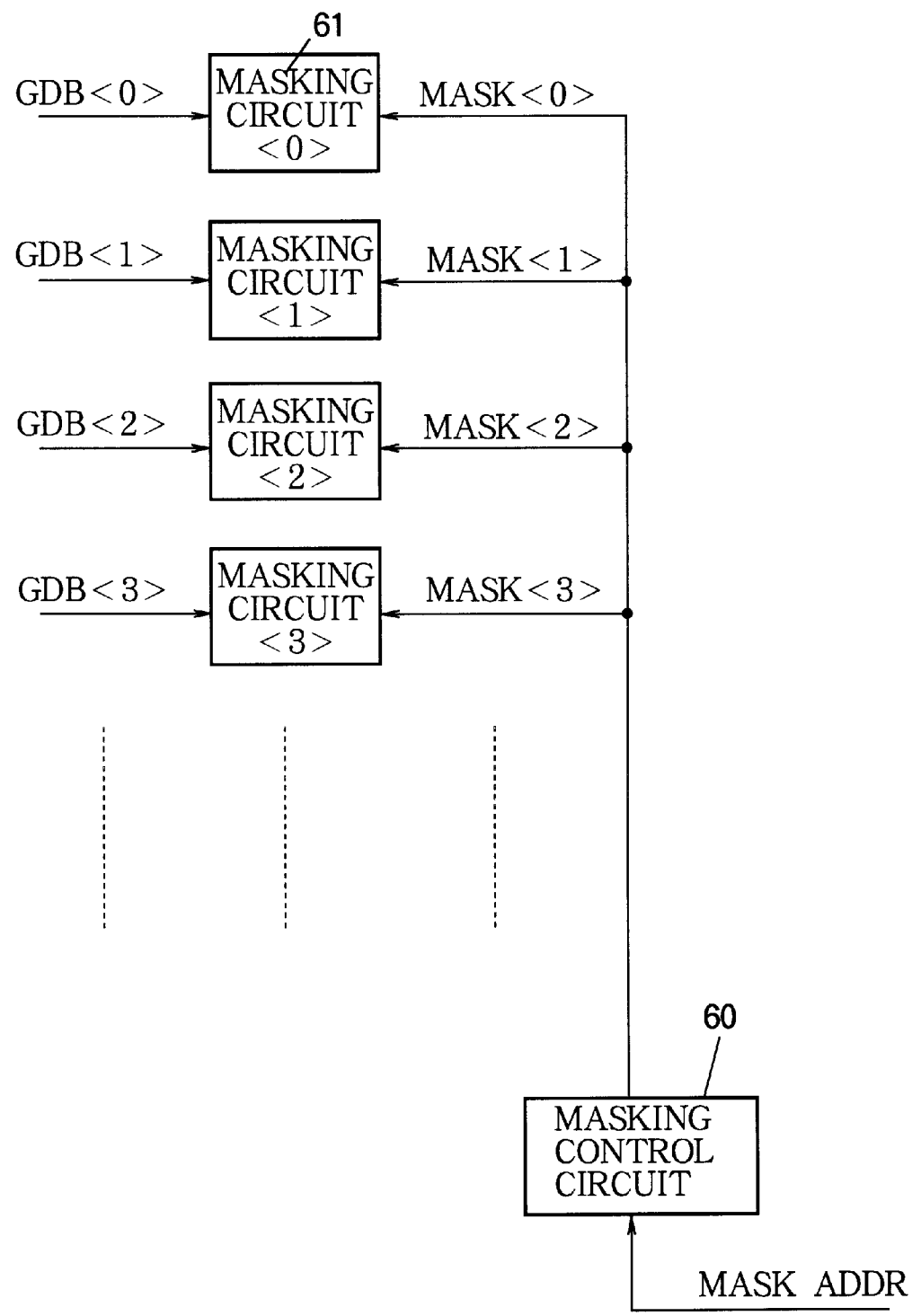
FIG. 13 is a block diagram illustrating a variation of the third embodiment.

FIG. 13 illustrates another variation of the third embodiment, in which the masking circuits 61 are disposed on the global data bus lines GDB<0>, GDB<1>, ... instead of being connected directly to the local data bus lines. If necessary, additional input-output buffers may be provided between the local and global data bus lines.

To further explain the advantages of the present invention, a more detailed description will now be given of some conventional semiconductor memory devices comparable to the preceding embodiments.

Figure 14:
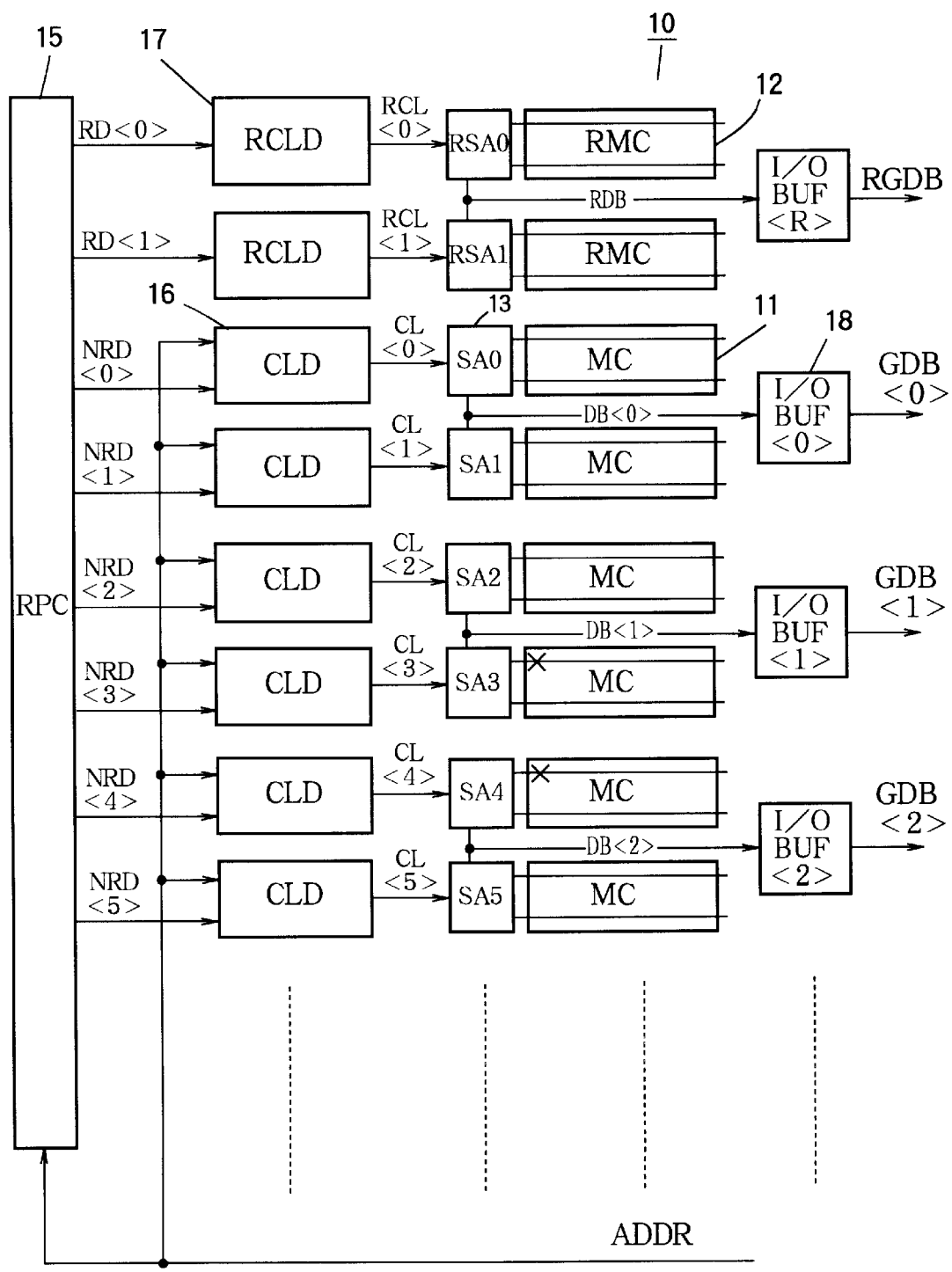
FIG. 14 is a block diagram of a first conventional semiconductor memory device.

FIG. 14 illustrates a conventional memory device in which the redundancy programming circuit 15 controls a plurality of non-redundant column line drivers (CLD) 16 that activate the non-redundant sense amplifiers 13, and two redundant column line drivers (RCLD) 17 that activate the redundant sense amplifiers 14. The memory cell array 10 and input-output buffers 18 are as described in the first embodiment, but the input-output buffers 18 are coupled directly to the global data bus lines. There is accordingly a redundant global data bus line RGDB in addition to the global data bus lines GDB<0>, GDB<1>, ....

The redundancy programming circuit 15 supplies a first redundant signal RD<0> to the first redundant column line driver 17, which drives a redundant column signal line RCL<0> that activates the first redundant sense amplifier RSA0, and supplies a second redundant signal RD<1> to the second redundant column line driver 17, which drives a redundant column signal line RCL<1> that activates the second redundant sense amplifier RSA1. The redundancy programming circuit 15 also supplies non-redundant signals NRD<n> to the non-redundant column line drivers 16, which drive column signal lines CL<n> activating the non-redundant sense amplifiers SAn, (n=0, 1, 2, ... ).

The non-redundant column line drivers 16 also receive the input address signal ADDR, one bit of which selects the even or odd columns.

Figure 15:
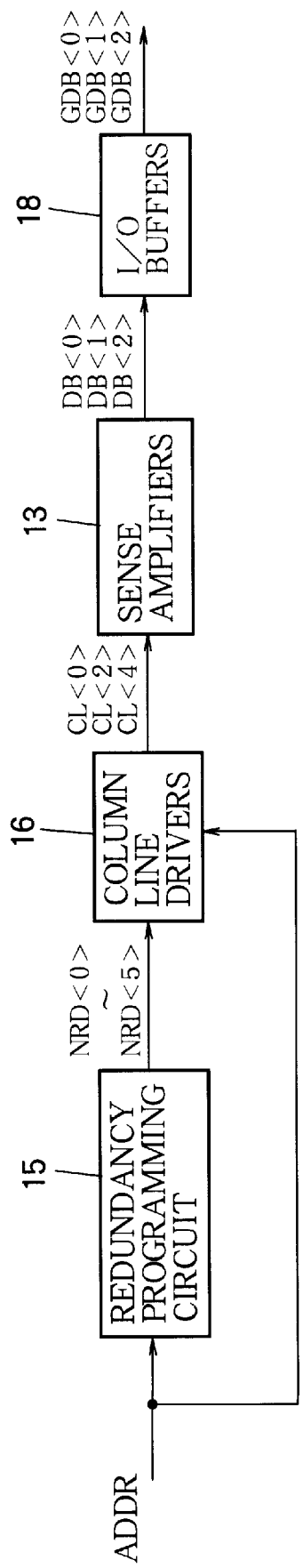
FIG. 15 is a simplified block diagram illustrating the operation of the first conventional semiconductor memory device.

FIG. 15 illustrates read access in this conventional memory device when there are no defective memory cells and the address signal selects the even-numbered columns. The redundancy programming circuit 15 activates the non-redundant signals NRD<0>. NRD<1>, .... The non-redundant column drivers 16, responding to these signals and the address signal ADDR, activate the even-numbered non-redundant column signal lines CL<0>, CL<2>, .... The even-numbered non-redundant sense amplifiers 13 place amplified data on data bus lines DB<0>, DB<1>, .... The input-output buffers 18 transfer the data to the global data bus lines GDB<0>, GDB<1>, ....

Figure 16:
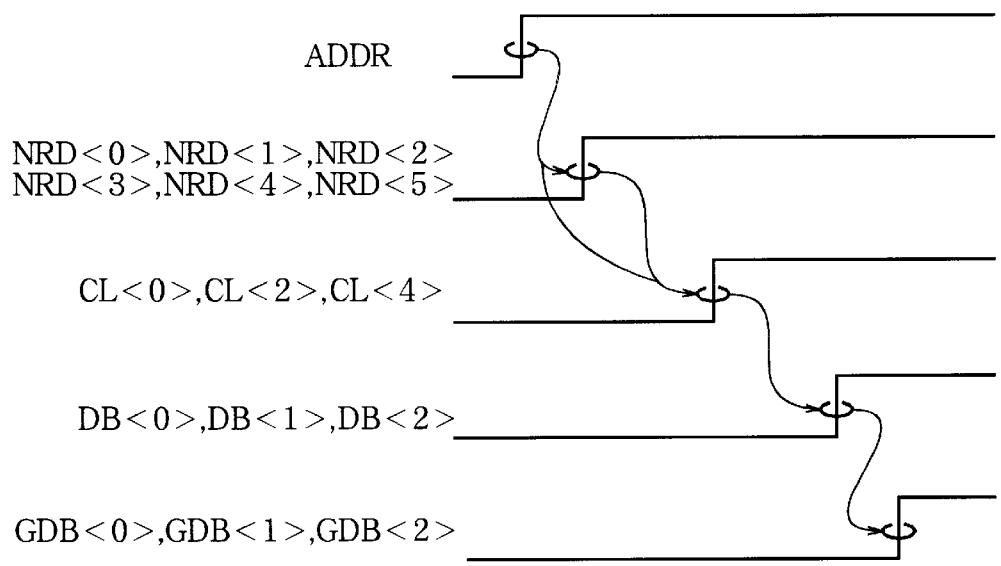
FIG. 16 is a timing diagram illustrating the operation shown in FIG. 15.

FIG. 16 illustrates the timing of this access operation. There are four steps, indicated by curly arrows, on the critical path leading from address input to output on the global data bus lines: output of the non-redundant signals, activation of the column signal lines, output of data from the sense amplifiers onto the data bus lines, and transfer of the data to the global data bus lines. In the first embodiment (FIG. 3), there were only three steps: activation of the column signal line, output of data from the sense amplifiers onto the data bus lines, and transfer of the data to the global data lines.

Figure 17:
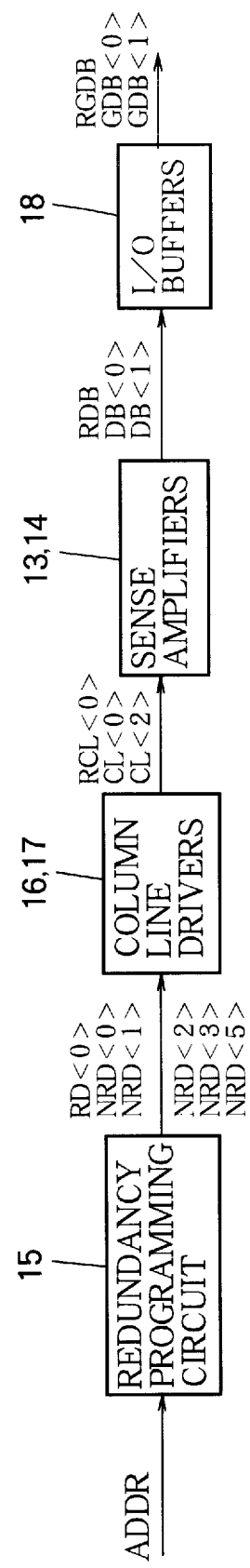
FIG. 17 is another simplified block diagram illustrating the operation of the first conventional semiconductor memory device.

FIG. 17 illustrates read access when a defective memory cell is present in non-redundant column four. The redundancy programming circuit 15 now activates redundant signal RD<0> instead of non-redundant signal NRD<4>. Redundant column signal line RCL<0> is thus driven in place of non-redundant column signal line CL<4>. The first redundant sense amplifier RSA<0> is activated and places amplified data on the redundant data bus line RDB. Non-redundant sense amplifier SA4 is not activated. The activated data are transferred through the input-output buffers 18 to non-redundant global data bus lines GDB<0>, GDB<1>, and the redundant global data bus line RGDB.

Figure 18:
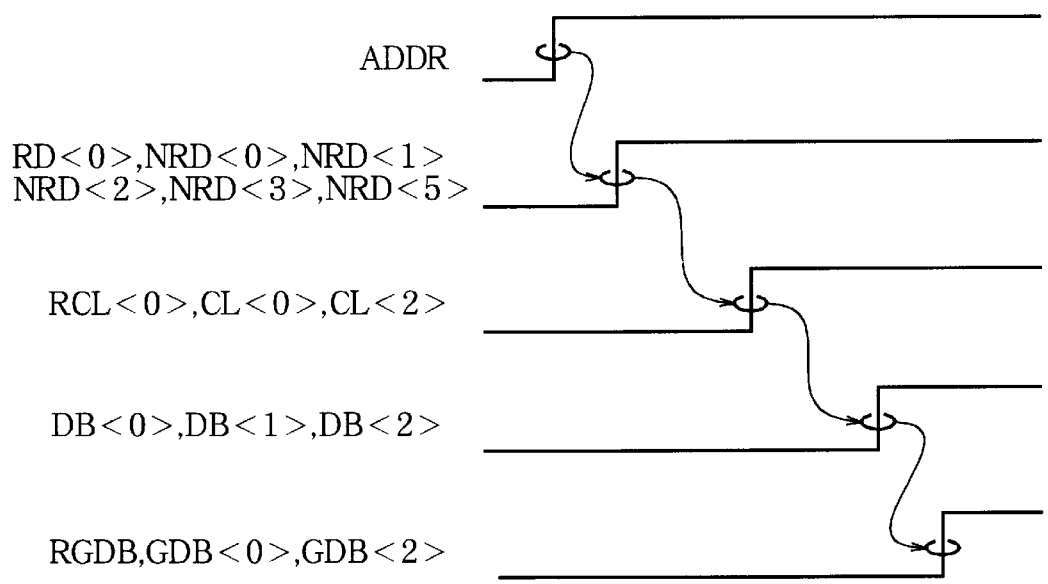
FIG. 18 is a timing diagram illustrating the operation shown in FIG. 17.

FIG. 18 illustrates the timing of this operation. Again, there are four steps on the critical path leading from address input to output of data on the global data bus lines, instead of the three steps of the first embodiment.

In addition to the delay caused by the extra step on the critical path, the physical distance between the data bus lines of the redundant data bit and the defective data bit it replaces may create timing problems. If data are taken from the global data bus lines in the sequence GDB<0>, GDB<1>, RGDB, GDB<3>, ... in synchronization with a high-speed clock signal, for example, problems may arise because RGDB is out of its natural place in the sequence. If the redundant global data bus line RDGB is significantly longer than global data bus lines GDB<1> and GDB<3>, for example, the longer signal propagation delay on RDGB may mean that data read from the redundant memory cells 12 are not available when required.

The extremely high clock speeds employed in synchronous access make such differences in signal line lengths and propagation times difficult to ignore. A further problem is that these differences can create differences in the shapes of the data waveforms. Since the memory device must be designed to operate correctly under worst-case conditions, timing differences and waveform differences such as these ultimately limit the performance of the memory device.

Figure 19:
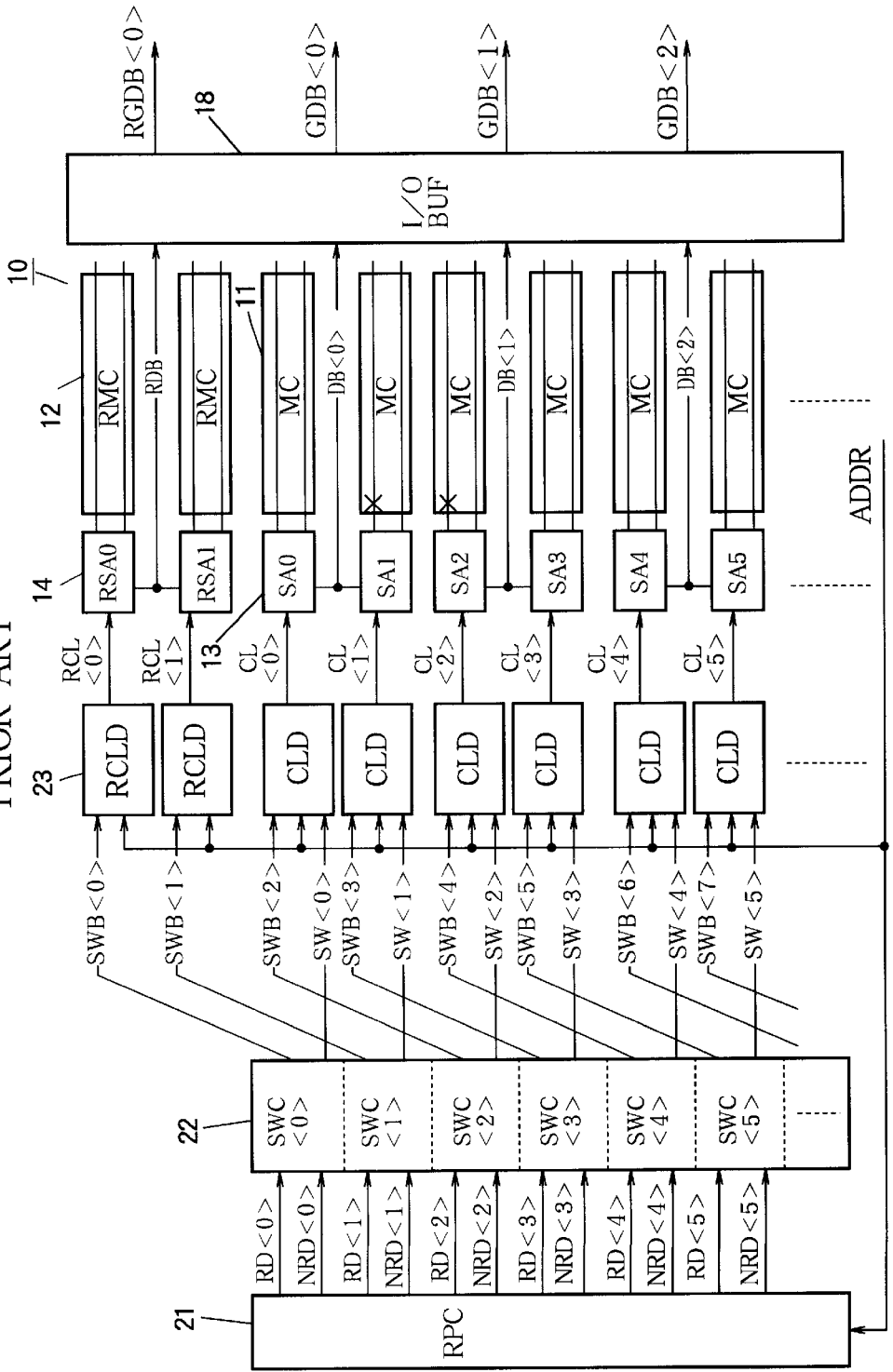
FIG. 19 is a block diagram of a second conventional semiconductor memory device.

FIG. 19 illustrates another conventional memory device, in which this last timing problem is eliminated by shifting columns, instead of replacing an isolated defective column. The redundancy programming circuit 21 generates redundant signals RD<n> and non-redundant signals NRD<n> for each column n (n=0, 1, ... ). Switching circuits 22 controlled by these signals generate switching signals SW<0>, SW<1>, ..., which are supplied to the non-redundant column line drivers 23, and switching signals SWB<0>, SWB<1>, ..., which are supplied to both redundant and non-redundant column line drivers 23. All of the column line drivers 23 also receive the address signal ADDR. The sense amplifiers 13, 14, memory cell array 10, and input-output buffers 18 operate as already described.

Figure 20:
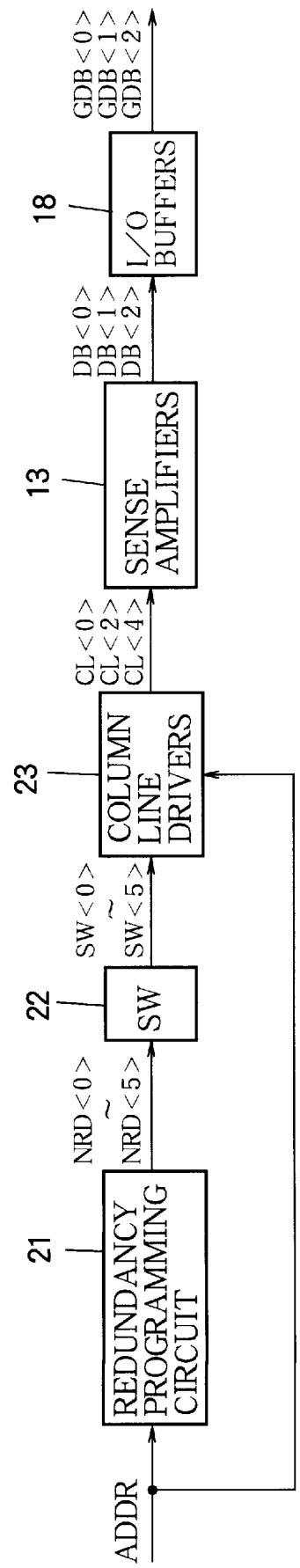
FIG. 20 is a simplified block diagram illustrating the operation of the second conventional semiconductor memory device.
Figure 21:
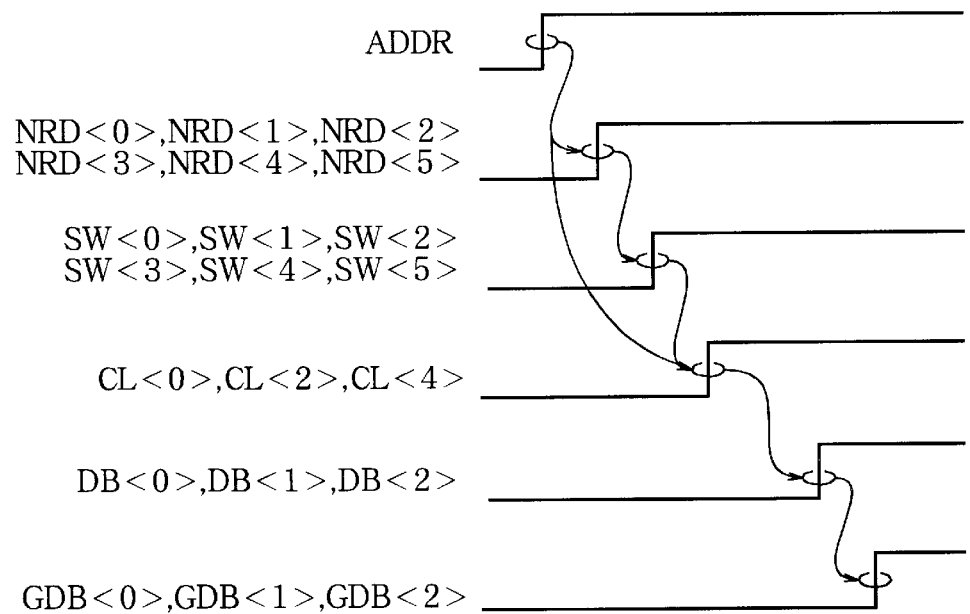
FIG. 21 is a timing diagram illustrating the operation shown in FIG. 20.

FIG. 20 illustrates read access in this conventional memory device when there are no defective memory cells and the even columns are addressed. The operation is similar to the operation shown in FIG. 15, with the additional output of switching signals SW<0>, SW<1>, . . . from the switching circuits 22 to the column line drivers 23. FIG. 21 illustrates the timing of this operation. Now there are five steps on the critical path from address input to data output on the global data bus lines, instead of the three steps in the first embodiment.

Figure 22:
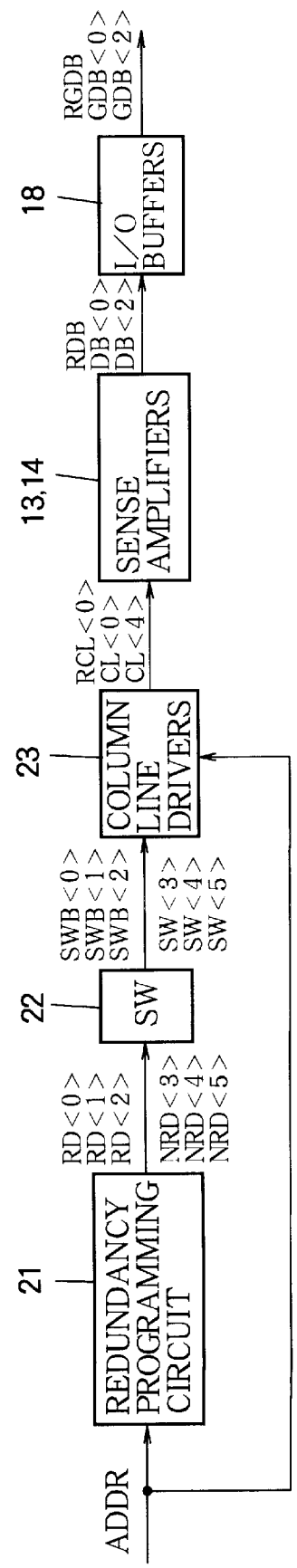
FIG. 22 is another simplified block diagram illustrating the operation of the second conventional semiconductor memory device.
Figure 23:
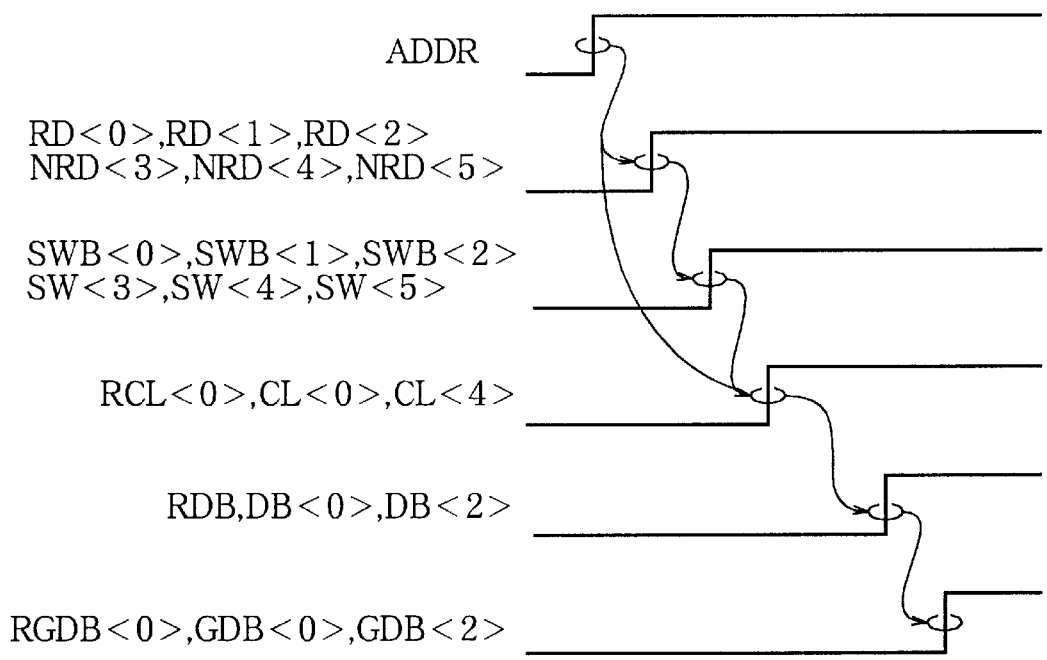
FIG. 23 is a timing diagram illustrating the operation shown in FIG. 22.

FIG. 22 illustrates the same operation when the even columns are addressed and there is a defective memory cell in the column of memory cells 11 coupled to sense amplifier SA2. The redundancy programming circuit 21 activates redundant signals RD<0>, RD<1>, RD<2> and non-redundant signals NRD<3>, NRD<4>, . . . . The switching circuits 22 respond by activating switching signals SWB<0>, SWB<1>, SWB<2>, SW<3>, SW<4>, . . . . The column line drivers 23 respond to the switching signals and address signal by activating column signal lines RCL<0>, CL<0>, CL<4>, . . . , omitting CL<2>. The sense amplifiers 13, 14, place amplified data on the redundant data bus line RDB and non-redundant data bus lines DB<0>, DB<2>, . . . , omitting DB<1>. The input-output buffers 18 transfer the data to global data bus lines RGDB, GDB<0>, GDB<2>, . . . , omitting GDB<1>. FIG. 23 illustrates the timing of this operation, again showing five steps on the critical path from address input to data output on the global data bus lines.

In this memory device, data can be taken from the global data bus lines in the sequence RGDB, GDB<0>, GDB<2>, . . . without timing problems, even in high-speed synchronous access, but the initial access speed is limited by the presence of five steps on the critical path, as compared with three in the invented memory device.

Figure 24:
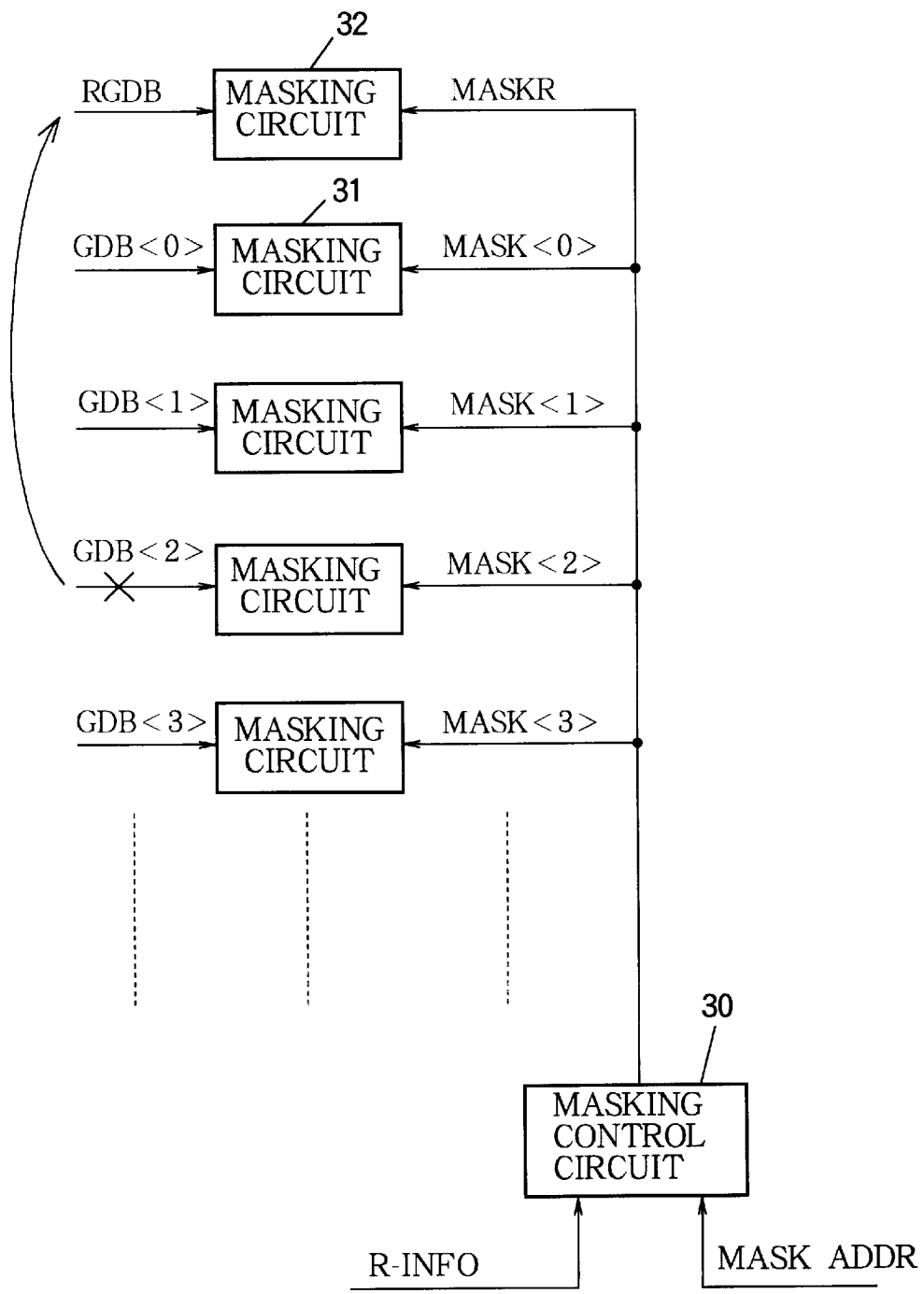
FIG. 24 and FIG. 25 are block diagrams illustrating masking in the conventional semiconductor memory devices.
Figure 25:
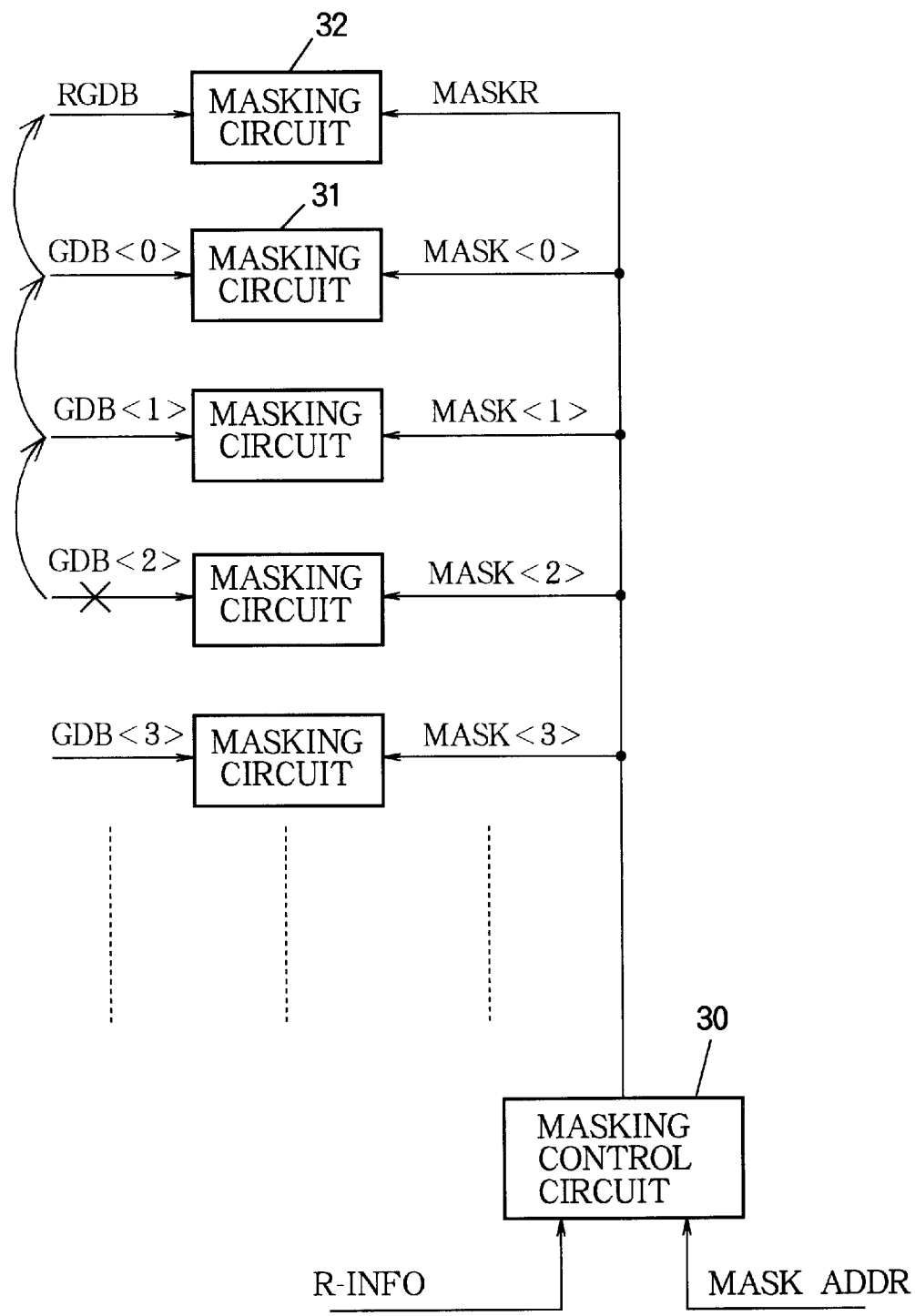

Referring to FIGS. 24 and 25, to provide a masked access capability, these conventional memory devices require masking circuits 31 for the global data bus lines GDB<0>, GDB<1>, . . . , and an additional redundant masking circuit 32 for the redundant global data bus line RGDB. Furthermore, the masking control circuit 30 must receive and process information R-INFO about the use of the redundant columns of memory cells 12, in addition to receiving mask address information MASK ADDR.

For example, when defective data on global data bus line GDB<2> are replaced by data on the redundant global data bus line RGDB, as shown in FIG. 24, the masking control circuit 30 must be informed, so that it can activate masking signal MASKR instead of masking signal MASK<2>. Alternatively, if the global data bus lines are shifted so as to omit the defective data on global data bus line GDB<2>, as shown in FIG. 25, then the masking control circuit 30 must again be informed, and must activate MASK<1> in place of MASK<2>, MASK<0> in place of MASK<1>, and MASKR in place of MASK<0>. The circuit configuration of the masking control circuit 30 is considerably larger and more complex than the configuration of the masking control circuit 60 in the third embodiment.

In contrast to these conventional memory circuits, the present invention eliminates both the problems of timing differences caused by out-of-order access to redundant columns, and limited access speed due to intervention of the redundancy programming circuit on the critical path from address input to data output. In a memory device with an access masking function, the present invention also simplifies the masking control circuit. In addition, the present invention has no redundant global data bus lines, which simplifies the interfacing of the global data bus to the external data input and output terminals of the memory device.

The present invention is applicable to any type of semiconductor memory having columns of memory cells coupled to sense amplifiers, with at least one redundant column of memory cells. Applicable types of DRAM include extended data-out (EDO) types, types with a pipelined burst (PB) mode, video RAM (VRAM), and pseudo-static RAM, besides the synchronous type mentioned earlier and various other types.

The data bus configuration is not limited to the configurations shown in the drawings, with local and global data bus lines interconnected through input-output buffers or masking circuits. Various other configurations are possible.

The address signal received by the redundancy programming circuit 51 in the present invention may be a column address signal, or may also include row address bits. In the former case, when a column includes even one defective memory cell, the entire column is replaced with a redundant column. Thus two redundant columns, for example, can provide for repair of faults in at most two non-redundant columns. In the latter case, a single redundant column can provide replacement memory cells for defective memory cells in many different non-redundant columns, depending on which row is being accessed.

Those skilled in the art will recognize that further variations are possible within the scope of the invention as claimed below.

What is claimed is:

1. A semiconductor memory device having a plurality of non-redundant sense amplifiers, a plurality of non-redundant memory cells coupled to said non-redundant sense amplifiers, at least one redundant sense amplifier, and a plurality of redundant memory cells coupled to said at least one redundant sense amplifier, said redundant memory cells being used to replace defective memory cells among said non-redundant memory cells, comprising:

a data bus with switchable data paths coupled to said non-redundant sense amplifiers and said at least one redundant sense amplifier;

a driving circuit, coupled to said non-redundant sense amplifiers and said at least one redundant sense amplifier, that simultaneously activates both said at least one redundant sense amplifier and at least one of said non-redundant sense amplifiers; and a redundancy control circuit that receives an address signal, and that produces a switching signal having a value that depends on whether a defective memory cell is addressed by said address signal, wherein said data bus with switchable data paths comprises a first data bus, coupled to said non-redundant sense amplifiers, that transfers data read from said non-redundant memory cells and amplified by said non-redundant sense amplifiers, a second data bus, coupled to said at least one redundant sense amplifier, that transfers data read from said redundant memory cells and amplified by said at least one redundant sense amplifier, a third data bus that transfers data read in accordance with said address signal, and a switching circuit, coupled to said first, second and third data buses and to receive the switching signal from said redundancy control circuit, that selects one of said first and second data buses in accordance with the value of the switching signal and that transfers the data on the selected one of said first and second data buses to said third data bus, thereby redirecting access from the defective memory cell to a redundant memory cell when the defective memory cell is addressed.

2. The semiconductor memory circuit of claim 1, wherein said first and second data buses comprise a plurality of data bus lines that are switchably coupled to said at least one redundant sense amplifier and said non-redundant sense amplifiers in a certain order, and said switching circuit redirects access by omitting said at least one of said non-redundant sense amplifiers from said certain order.

3. The semiconductor memory circuit of claim 2, wherein said data bus has a plurality of data bus lines, said switching circuit comprises:
   a first plurality of switches coupling said data bus lines to said non-redundant sense amplifiers in a first order; and
   a second plurality of switches coupling said data bus lines to said non-redundant sense amplifiers and said at least one redundant sense amplifier in a second order, said second order being obtained by shifting said first order toward said at least one redundant sense amplifier,
   said redundancy control circuit comprising a redundancy programming circuit controlling said first plurality of switches and said second plurality of switches.

4. The semiconductor memory circuit of claim 3, further comprising a plurality of input-output buffers respectively coupled to said data bus lines, said first plurality of switches being disposed between said input/output buffers and said non-redundant sense amplifiers.

5. The semiconductor memory circuit of claim 3, further comprising a plurality of masking circuits respectively coupled to said data bus lines, said first plurality of switches being disposed between said masking circuits and said non-redundant sense amplifiers.

6. The semiconductor memory circuit of claim 1, wherein said driving circuit activates said non-redundant sense amplifiers selectively in response to said address signal.

7. The semiconductor memory circuit of claim 1, wherein said switching circuit redirects access from said memory cells coupled to a single one of said non-redundant sense amplifiers to said redundant memory cells coupled to said at least one redundant sense amplifier.

8. The semiconductor memory circuit of claim 1, wherein said switching circuit redirects access from said memory cells coupled to different ones of said non-redundant sense amplifiers to said redundant memory cells coupled to said at least one redundant sense amplifier.

9. The semiconductor memory circuit of claim 1, wherein the semiconductor memory circuit is a dynamic random-access memory circuit.

10. A method of controlling access to redundant memory cells and non-redundant memory cells, in a semiconductor memory device having a plurality of non-redundant sense amplifiers coupled to said non-redundant memory cells, at least one redundant sense amplifier coupled to said redundant memory cells, said redundant memory cells being used to replace defective memory cells among said non-redundant memory cells, and a data bus,
   said data bus including a first data bus that is coupled to said non-redundant sense amplifiers and that transfers data read from said non-redundant memory cells and amplified by said non-redundant sense amplifiers, a second data bus that is coupled to said at least one redundant sense amplifier and that transfers data read from said redundant memory cells and amplified by said at least one redundant sense amplifier, and a third data bus that transfers data read in accordance with the address signal, the method comprising:

simultaneously activating both said at least one redundant sense amplifier and at least one of said non-redundant sense amplifiers; and
switching data paths on said data bus, thereby redirecting access from a defective one of said non-redundant memory cells to one of said redundant memory cells,
said switching data paths including
   producing a switching signal having a value which depends on whether a defective memory cell is addressed by an address signal,
   selecting one of said first and second data buses in accordance with the value of the switching signal, and
   transferring data on the selected one of said first and second data buses to said third data bus.

11. The method of claim 10, wherein each of said first and second data buses comprises a plurality of data bus lines, said switching data paths further comprises:
   disconnecting a first one of said data bus lines from a first of said non-redundant sense amplifiers coupled to a defective one of said non-redundant memory cells;
   connecting a second one of said data bus lines to a first of said at least one redundant sense amplifier coupled to one of said redundant memory cells; and
   shifting connections of said first one of said data bus lines and all of said data bus lines disposed between said first one of said data bus lines and said second one of said data bus lines away from said first of said non-redundant sense amplifiers and toward said first of said at least one redundant sense amplifier.

12. The method of claim 10, wherein the semiconductor memory device includes a redundancy control circuit having a redundancy programming circuit, the method further comprising:
   programming said redundancy programming circuit with addresses of defective memory cells;
   receiving said address signal; and
   comparing said address signal with addresses of defective memory cells.

13. The method of claim 12, wherein said simultaneously activating is carried out in response to said address signal.

14. The method of claim 11, wherein access to all of said non-redundant memory cells coupled to said first of said non-redundant sense amplifiers is redirected to said redundant memory cells that are coupled to said first of said at least one redundant sense amplifier.

15. The method of claim 11, wherein access to defective memory cells coupled to at least two different sense amplifiers among said sense amplifiers is redirected to said redundant memory cells that are coupled to said first of said at least one redundant sense amplifier.

16. A semiconductor memory device having a plurality of non-redundant sense amplifiers, a plurality of non-redundant memory cells coupled to the non-redundant sense amplifiers, at least one redundant sense amplifier, and a plurality of redundant memory cells coupled to the at least one redundant sense amplifier, the redundant memory cells being used to replace defective memory cells among the non-redundant memory cells, comprising:
   a data bus with switchable data paths coupled to the non-redundant sense amplifiers and the at least one redundant sense amplifier;
   a redundancy control circuit, coupled to said data bus and receiving an address signal, that switches the data paths when defective memory cells are addressed by the address signal, thereby redirecting access from the defective memory cells to the redundant memory cells; and a driving circuit, coupled to said non-redundant sense amplifiers and the at least one redundant sense amplifier, that simultaneously activates both the at least one redundant sense amplifier and at least one of the non-redundant sense amplifiers, when said redundancy control circuit redirects access from one of the defective memory cells coupled to the at least one of the non-redundant sense amplifiers to one of the redundant memory cells coupled to the at least one redundant sense amplifier, the data paths comprising a plurality of data bus lines that are switchably coupled to the at least one redundant sense amplifier and the non-redundant sense amplifiers in a certain order, said redundancy control circuit switches the data paths by omitting the at least one of the non-redundant sense amplifiers from the certain order.

17. The semiconductor memory circuit of claim 16, wherein the data bus has a plurality of data bus lines, said redundancy control circuit comprising:

a first plurality of switches that couple the data bus lines to the non-redundant sense amplifiers in a first order;

a second plurality of switches that couple the data bus lines to the non-redundant sense amplifiers and the at least one redundant sense amplifier in a second order, the second order being obtained by shifting the first order toward the at least one redundant sense amplifier; and a redundancy programming circuit that controls said first plurality of switches and said second plurality of switches, the semiconductor memory circuit further comprising a plurality of input-output buffers respectively coupled to the data bus lines, said first plurality of switches being disposed between said input-output buffers and the non-redundant sense amplifiers.

18. The semiconductor memory circuit of claim 16, wherein the data bus has a plurality of data bus lines, said redundancy control circuit comprising:

a first plurality of switches that couple the data bus lines to the non-redundant sense amplifiers in a first order;

a second plurality of switches that couple the data bus lines to the non-redundant sense amplifiers and the at least one redundant sense amplifier in a second order, the second order being obtained by shifting the first order toward the at least one redundant sense amplifier; and a redundancy programming circuit that controls said first plurality of switches and said second plurality of switches, the semiconductor memory circuit further comprising a plurality of masking circuits respectively coupled to the data bus lines, said first plurality of switches being disposed between said masking circuits and the non-redundant sense amplifiers.

* * * * *